(12) United States Patent
Jain et al.

(10) Patent No.: US 8,154,275 B2
(45) Date of Patent: Apr. 10, 2012

(54) APPARATUS AND METHOD FOR TESTING SENSE AMPLIFIER THRESHOLDS ON AN INTEGRATED CIRCUIT

(75) Inventors: Ashish R. Jain, Santa Clara, CA (US); Edgardo F. Klass, Palo Alto, CA (US)

(73) Assignee: Apple Inc., Cupertino, CA (US)

( * ) Notice: Subject to any disclaimer, the term of this patent is extended or adjusted under 35 U.S.C. 154(b) by 352 days.

(21) Appl. No.: 12/503,315

(22) Filed: Jul. 15, 2009

(65) Prior Publication Data

US 2011/0012643 A1  Jan. 20, 2011

(51) Int. Cl.
  *G01R 1/30* (2006.01)
  *G01R 31/02* (2006.01)
(52) U.S. Cl. .................. 324/123 R; 324/762.01
(58) Field of Classification Search ............... 324/123 R, 324/762.01–762.06; 327/524
  See application file for complete search history.

(56) References Cited

U.S. PATENT DOCUMENTS

| | | | |
|---|---|---|---|
| 3,845,401 A * | 10/1974 | Troiani et al. ............... 330/2 |
| 5,528,610 A * | 6/1996 | Edler et al. .................. 714/727 |
| 6,137,319 A * | 10/2000 | Krishnamurthy et al. ...... 327/51 |
| 6,365,914 B1 * | 4/2002 | Yamadate ..................... 257/48 |
| 6,785,853 B2 * | 8/2004 | Takahashi ..................... 714/724 |
| 7,656,728 B2 | 2/2010 | Choi |
| 7,689,950 B2 | 3/2010 | Aipperspach et al. |

* cited by examiner

*Primary Examiner* — Huy Q Phan
*Assistant Examiner* — Joshua Benitez
(74) *Attorney, Agent, or Firm* — Meyertons, Hood, Kivlin, Kowert & Goetzel, P.C.; Stephen J. Curran

(57) ABSTRACT

An apparatus and method for testing sense amplifier threshold voltages on an integrated circuit includes one or more sense amplifier modules each including a number of sense amplifier circuits, a voltage generator unit, and detection logic. The voltage generator unit may select a differential voltage to supply to at least some of the sense amplifier circuits, and each sense amplifier circuit may be configured to generate an output value that is dependent upon the applied differential voltage in response to receiving an enable signal. The detection logic may detect and capture an output value of each of the sense amplifier circuits. In one implementation, the voltage generator unit may iteratively select a different differential voltage in response to a control input. Accordingly, the detection logic may capture the output value of the sense amplifiers after each change in differential voltage.

12 Claims, 4 Drawing Sheets

APPARATUS AND METHOD FOR TESTING SENSE AMPLIFIER THRESHOLDS ON AN INTEGRATED CIRCUIT

BACKGROUND OF THE INVENTION

1. Field of the Invention

This invention relates to integrated circuits and, more particularly, to sense amplifier test circuits.

2. Description of the Related Art

Circuits such as sense amplifiers may detect very small differential voltages at their input, and output a digital value that corresponds to the differential input. For example, in a memory cell such as a static random access memory (SRAM) having a pair of differential bit lines connected to a sense amplifier, the sense amplifier is used to detect the difference between the bit lines. Depending on the process parameters during manufacturing, it may be possible for the SRAM cells to have very small differential voltage outputs. In addition, the sense amplifiers themselves may have varying thresholds between manufacturing lots. This variability may present reliability problems.

The manufacturing of integrated circuits is a complex process. Bringing a new circuit design to a fabrication facility, or bringing an existing circuit design to a new fabrication facility may require a number of characterization steps to establish a device library. Depending on the process technology, and the complexity of the circuits, there may be several iterations of process adjustments to ensure reliable operation of the manufactured devices. In many cases, there may be several revisions of silicon before the design is fully operational. Accordingly, it may be desirable to provide a robust circuit design while reducing the number of iterations of process adjustments, particularly during device and process characterization.

SUMMARY

Various embodiments of an apparatus and method for testing sense amplifier threshold voltages on an integrated circuit are disclosed. In one embodiment, an integrated circuit may include one or more sense amplifier modules. Each of the sense amplifier modules may include a number of sense amplifier circuits, a voltage generator unit, and detection logic. The voltage generator unit may be configured to select a differential voltage to supply to at least some of the sense amplifier circuits. In addition, each sense amplifier circuit may be configured to generate an output value that is dependent upon the applied differential voltage in response to receiving an enable signal. Further, the detection logic may be coupled to each sense amplifier circuit and may be configured to detect and capture an output value of each of the sense amplifier circuits. In one implementation, the voltage generator unit may be configured to iteratively select a different differential voltage in response to a control input. For example, the voltage generator unit may select a different output node of a voltage divider as an output. Accordingly, the detection logic may capture the output value of the sense amplifiers after each change in differential voltage.

In another embodiment, a method includes executing a sense amplifier test using a sense amplifier module having a number of sense amplifier circuits on an integrated circuit. Executing the sense amplifier test may include a voltage generator unit selectably supplying a differential voltage to at least some of the sense amplifier circuits. The method may also include the sense amplifier circuits generating an output signal that is dependent upon the applied differential voltage in response to receiving an enable signal. The method may further include detection logic detecting an output value of the sense amplifier circuits.

Figure 1:
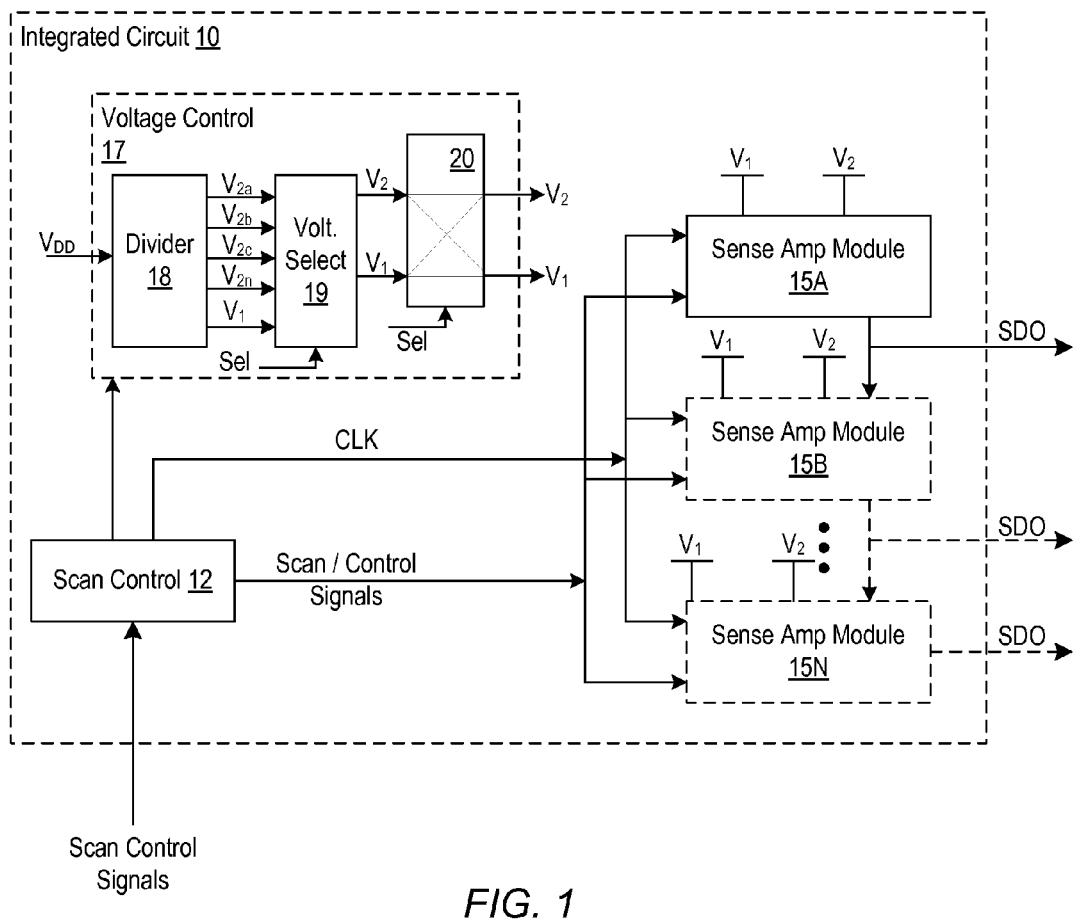
FIG. 1 is a block diagram of one embodiment of an integrated circuit including sense amplifier modules.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims. The headings used herein are for organizational purposes only and are not meant to be used to limit the scope of the description. As used throughout this application, the word "may" is used in a permissive sense (i.e., meaning having the potential to), rather than the mandatory sense (i.e., meaning must). Similarly, the words "include," "including," and "includes" mean including, but not limited to.

Various units, circuits, or other components may be described as "configured to" perform a task or tasks. In such contexts, "configured to" is a broad recitation of structure generally meaning "having circuitry that" performs the task or tasks during operation. As such, the unit/circuit/component can be configured to perform the task even when the unit/circuit/component is not currently on. In general, the circuitry that forms the structure corresponding to "configured to" may include hardware circuits. Similarly, various units/circuits/components may be described as performing a task or tasks, for convenience in the description. Such descriptions should be interpreted as including the phrase "configured to." Reciting a unit/circuit/component that is configured to perform one or more tasks is expressly intended not to invoke 35 U.S.C. §112, paragraph six interpretation for that unit/circuit/component.

DETAILED DESCRIPTION

Turning now to FIG. 1, a block diagram of one embodiment of an integrated circuit is shown. The integrated circuit 10 includes a number of sense amplifier modules designated 15A, 15B and 15N. As denoted by the dashed lines, in various embodiments, there may be a single sense amplifier module or there may be any number of sense amplifier modules (as denoted by the letter N in 15N). In addition, the integrated circuit 10 includes a scan control unit 12 that is coupled to provide scan control and other control signals and a clock (CLK) signal to sense amplifier module 15A through 15N. Further, in the illustrated embodiment, the integrated circuit 10 includes a voltage control unit 17 that is coupled to the scan control unit and to a voltage supply ($V_{DD}$). It is noted that components having a reference designator including a number and a letter may be referred to by the number alone where appropriate.

The scan control unit 12 is coupled to receive various control and scan control signals from a source external to the integrated circuit (e.g. another component of the system that includes the integrated circuit 10, not shown in FIG. 1, or from a test system that may be connected directly or indirectly to the integrated circuit 10). As will be described in greater detail below, the sense amplifier modules 15 may be coupled serially into a scan chain (e.g., from sense amplifier module 15A to sense amplifier module 15B to sense amplifier module 15N to the scan data out (SDO) output of the integrated circuit 10, in the illustrated embodiment) to permit results to be scanned out of the sense amplifier modules 15A-15N for observation external to the integrated circuit 10. Alternatively, one or more of the sense amplifier modules 15 may be included in separate scan chains (e.g., with core logic circuitry, not shown in FIG. 1). There may also be a scan data input at the head of the scan chain, which may not be used by the sense amplifier modules 15 (the scan in data may be a don't care), but could be used by core circuitry included in the scan chain.

Figure 2:
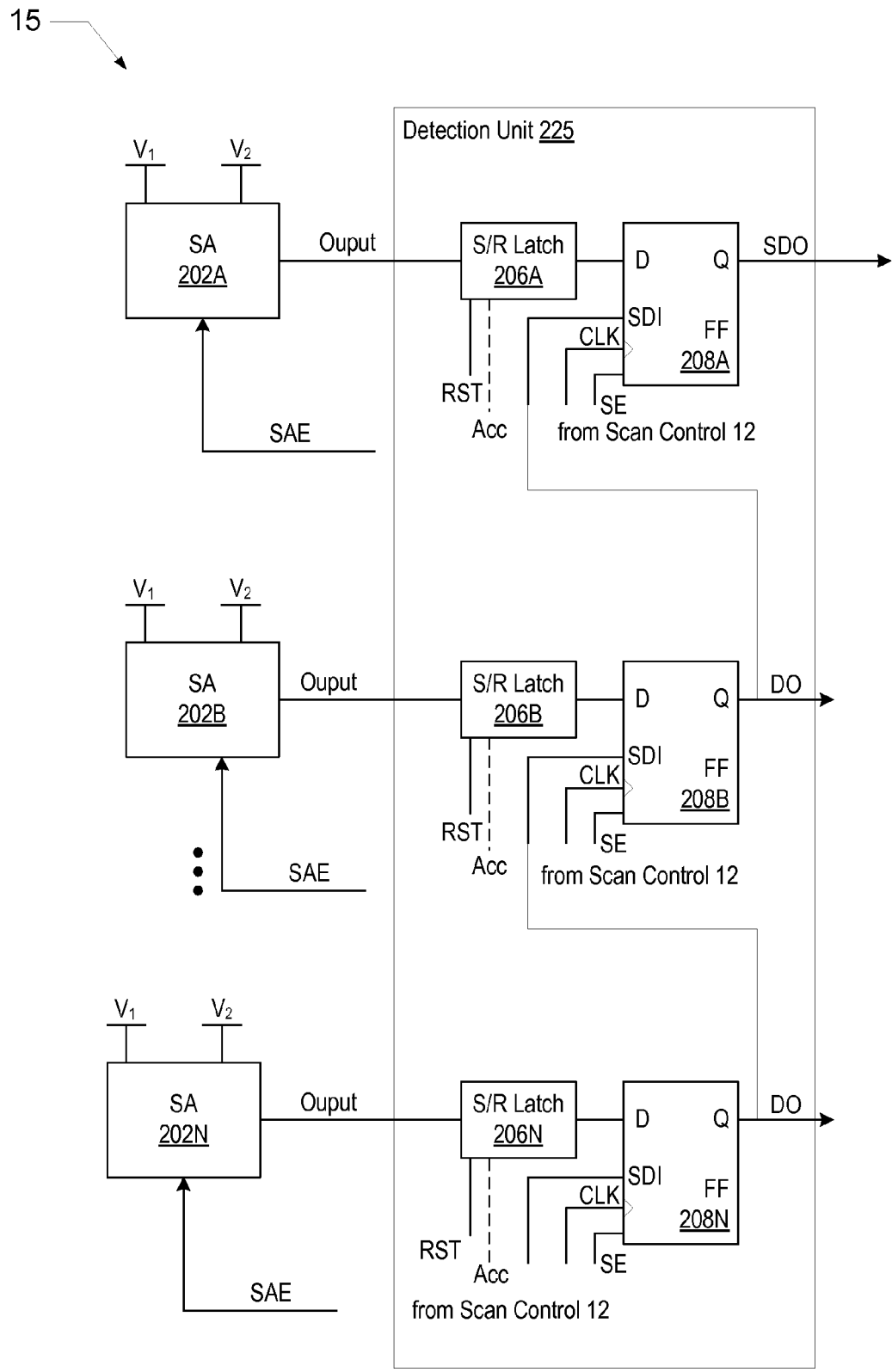
FIG. 2 is a diagram of one embodiment of a sense amplifier module shown in FIG. 1.

In one embodiment, sense amplifier modules 15 may include circuitry configured to detect differential voltage thresholds at which one or more sense amplifier circuits either operate reliably, or cease to operate reliably. More particularly, as shown in FIG. 2, one or more sense amplifier modules 15 may be coupled to a differential voltage supply (e.g., $V_1$ and $V_2$). To determine the differential voltage threshold of a sense amp 15, in one embodiment, one of the voltage supplies (e.g., $V_1$) may be held constant while the other voltage supply (e.g., $V_2$) may be iteratively changed (e.g., increased or decreased) some number of times. After each change in the differential voltage, the sense amplifier 15 is enabled. The output signal or 'output value' of each sense amplifier 15 may be detected and captured to determine the operational voltage thresholds of the sense amplifiers. This configuration is shown in FIG. 2 and described more fully below.

In one embodiment, voltage control unit 17 may be configured to increase or decrease the $V_2$ voltage supplies in response to control signals provided by the scan control unit 12, and/or from an external source such as a test system (not shown). In the illustrated embodiment, voltage control unit 17 includes a voltage divider 18, coupled to a voltage select unit 19, which is coupled to a voltage swap unit 20. In one embodiment, the voltage divider may receive an input voltage such as $V_{DD}$ and generate multiple voltages (e.g., $V_{2a}$ through $V_{2n}$) from the input voltage. Accordingly, the voltage divider 18 may include a number of nodes (not shown) and a voltage tap from each node. In addition, the voltage select unit 19 may select which of the $V_2$ voltages to output depending on a select input. In one implementation, the voltage select unit 19 may include multiplexer with a plurality of inputs and a single output. The voltage swap unit 20 may be configured to swap the voltages $V_1$ and $V_2$ that are output to the sense amplifiers 15 in response to a selection input signal. It is noted that in other embodiments, as denoted by the dashed lines, the entire voltage control unit 17 or various portions thereof may alternatively be included within each sense amplifier module 15.

In an alternative embodiment, instead of using a voltage control unit 17 as shown in FIG. 1, the external test system (not shown) may provide the $V_1$ and $V_2$ supply voltages. In such embodiments, the test system may increase and decrease the supply voltages directly as desired.

Referring to FIG. 2, a diagram of one embodiment of a sense amplifier module 15 is shown. The sense amplifier module 15 includes a number of sense amplifier circuits designated 202A through 202N, where N may be any whole number. Each sense amplifier circuit 202 is coupled to the two voltage supplies: $V_1$ and $V_2$. In addition, each sense amplifier 202 is coupled to receive a sense amp enable (SAE) signal, and to provide an output signal. As shown, each of the sense amplifier circuits 202 is coupled to a detection unit 225. In the illustrated embodiment, the detection unit 225 includes a number of set/reset (S/R) latches (e.g., 206A through 206N), and a number of flip-flops (e.g., 208A through 208N).

As shown, the output of each sense amplifier circuit 202 is coupled to a respective S/R latch 206. The output of each S/R latch is coupled to a respective flip-flop 208. In the illustrated embodiment and as mentioned above, the flip-flops 208 are coupled together serially such that the output of one flip-flop (e.g., FF208N) is coupled to the scan data in (SDI) input of a next flip-flop (e.g., FF208B). The last flip-flop output is labeled scan data out (SDO). In addition, each flip-flop is coupled to receive scan control signals (e.g., CLK, and scan enable (SE)) from scan control unit 12 of FIG. 1. Similarly, each S/R latch 206 is coupled to receive control signals such as a reset (RST) signal and, in some embodiments, an accumulate (ACC) signal, for example.

During operation, the supply voltages, $V_1$ and $V_2$, may applied to each sense amplifier circuit 202, and the SAE signal may be asserted to each sense amplifier circuit 202. The output values of the sense amplifiers 202 are latched, and may be output for observation. For example, when a sense amp circuit 202 is disabled a logic value of zero may be the output value. When the sense amp circuit 202 is enabled, the magnitude of the differential voltage at the input of the sense amp circuit 202 determines whether the sense amp circuit 202 will continue to output a zero, or if it will output a logic value of one. Each S/R latch 206 may be reset with the RST signal to clear the latch. At predetermined intervals, one of the supply voltages (e.g., $V_2$) may be either increased or decreased while the other supply voltage (e.g., $V_1$) is held substantially constant, and the output values of the sense amplifier circuits 202 may be latched. During the time that the changing supply voltage is at a given differential voltage, control signals may be applied to the sense amp circuits 202 and to detection unit 225. For example, in one mode, the CLK signal may transition to clock FF208A-208N to capture the output of the S/R latches 206A-206N. The S/R latches may be reset with the RST signal, and the scan enable signal (SE) may be asserted so that the captured values may be scanned out of the flip-flops 208 and analyzed or stored for future analysis. This or a similar sequence may be repeated for each change in differential voltage.

By analyzing the sense amplifier output values across some range of input differential voltages, the threshold differential voltage at which the sense amplifiers output a logic value of one may be determined. Similarly, a logic level of zero may be applied to the input of the sense amplifiers 202 to ensure that the sense amplifiers 202 can correctly output a logic value of zero across some range of differential voltages. Further, in other test sequences, the $V_1$ and the $V_2$ voltage supplies may be swapped to ensure that the differential voltages may be detected via the other inputs to the sense amp circuits 202.

In another embodiment, the S/R latches 206 may operate in an "accumulate" node in which the ACC signal may be applied to the S/R latches 206. In the accumulate mode, each S/R latch 206 may be configured to receive feedback from the FF208 to which it is connected. Each FF208 may then be clocked some predetermined number of times, and the S/R latch retains the output value from the respective FF208 until the output of the sense amplifier 202 changes. In such an embodiment, each S/R latch 206 may include additional circuitry such as combinatorial and multiplexing logic (not shown), for example. After the predetermined number of clocks, the captured values may be scanned out and analyzed or stored for future analysis.

Depending on the captured value of each of FF 208, the threshold differential voltage of each of the sense amplifier circuits 202 may be determined. For example, for a given differential voltage applied, and the sense amp circuit is enabled, if the captured sense amplifier output value is a logic value of one, then the sense amplifier 202 was able to correctly output a logic value of one across the range of supply voltages. Accordingly, the differential voltage at which the output transitioned to a one may be determined. In a similar way, the operation may be tested for an input logic value of zero.

In one implementation, there may be 12 sense amplifier circuits 202 in a given sense amplifier module 15. In addition, there may be any number of such sense amplifier modules 15 on integrated circuit 10. As such, to obtain a desirable distribution of threshold values, there may be multiple instantiations of the sense amplifier module 15 on the integrated circuit 10.

Figure 3:
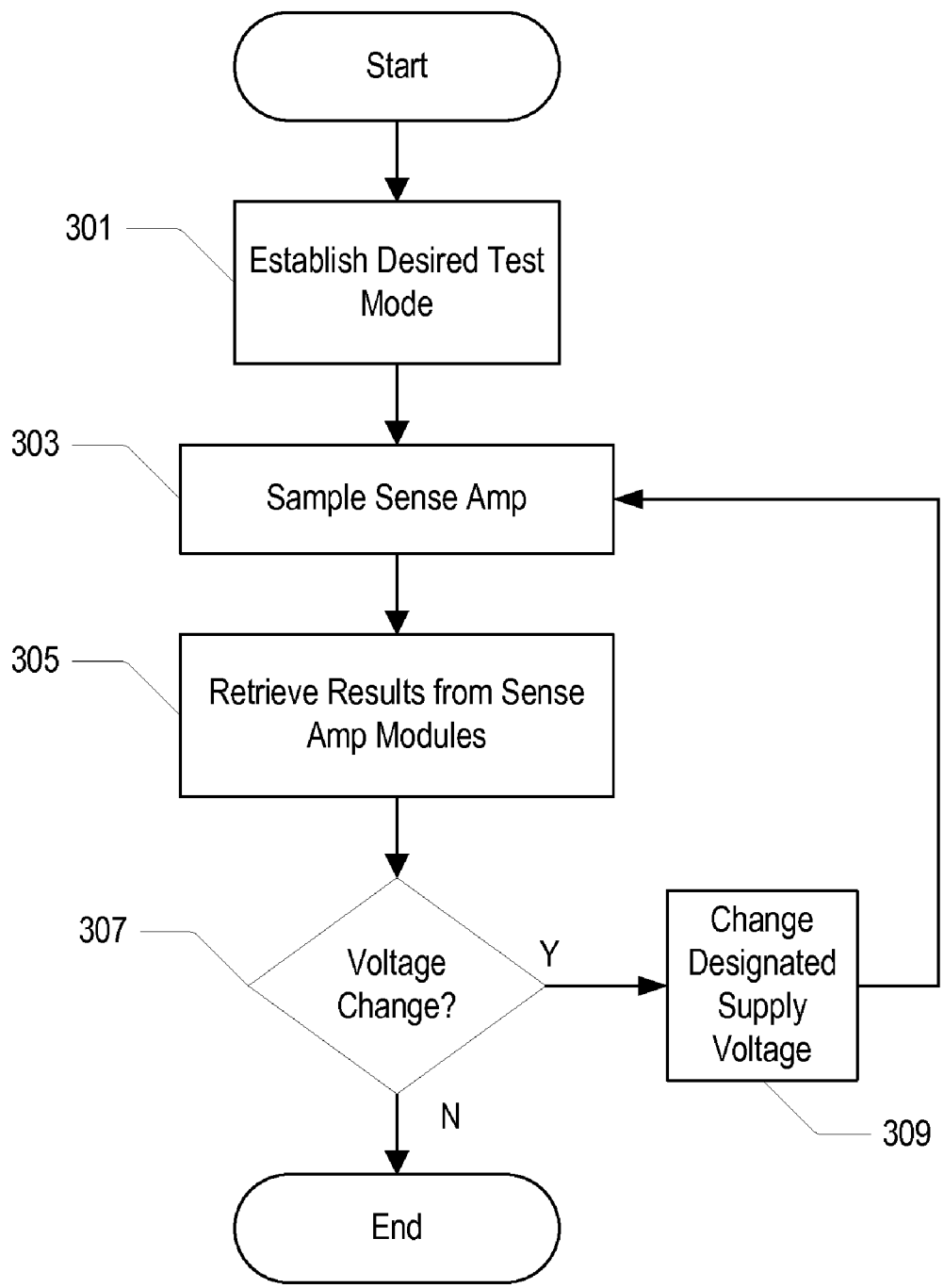
FIG. 3 is a flow diagram describing operational aspects of the embodiments of the sense amplifier module depicted in FIG. 1 and FIG. 2.

In FIG. 3, a flow diagram that depicts the operation of one embodiment of integrated circuit 10 is shown. While the blocks are shown in a particular order for ease of understanding, other orders may be used. Referring collectively to FIG. 1 through FIG. 3 and beginning in block 301 of FIG. 3, the desired test mode may be established in some embodiments. For example, in one embodiment, the supply voltages $V_1$ and $V_2$ may be applied to each sense amplifier circuit 202. In other embodiments, a specific test mode may be invoked. After a predetermined amount of time has elapsed, the sense amplifiers may be enabled, and the flip-flops 208 of FIG. 2 may be clocked one or more times to capture or sample the output level corresponding to the sense amplifier output (block 303). In one embodiment, the scan control unit 12 may provide the sense amp enable signal and may clock the flip-flops. Alternatively, other clock circuitry (not shown) may provide the sense amp enable signal and/or clock the flip-flops.

In one embodiment, once the flip-flops have captured the output levels, the results may be retrieved (block 305). For example, in one embodiment, the scan control unit 12 may gate the CLK signal, assert the SE signal to the flip-flops and then provide a number of CLK pulses sufficient to clock the flip-flop values serially through one or more scan chains that include the flip-flops, and out the SDO pin of the IC 10 as described above. Based upon the digital values scanned out, a determination may be made as to what, if any, the threshold voltage may be for a given sense amplifier circuit 202.

In various embodiments, the scan data may be output to a device tester, or other system or device used for testing integrated circuits. Alternatively, the results may stored into a memory (not shown) located on or off the integrated circuit 10 for future retrieval and analysis.

Once the captured values have been retrieved, if there are more differential voltages to check (block 307), a different differential voltage is applied by, for example, changing a designated one of the supply voltages (e.g., $V_2$ may be increased or decreased) by a predetermined amount (block 309). Operation proceeds as described above in block 303 in which the sense amp circuits 202 are enabled and the flip-flops 208 of FIG. 2 may be clocked one or more times to capture or sample the output level corresponding to the sense amplifier output. Referring back to block 307, if all differential voltage levels have been checked, the sense amplifier test is complete.

As mentioned above, in one embodiment, the above testing procedure may be implemented using a test system (not shown) suitably connected to integrated circuit 10. The test system may include some type of processing unit that may execute test software which may cause various events to occur. For example, in various embodiments, in response to execution of the test instructions, the test system may provide signals corresponding to the scan control signals, one or more clock signals, one or more supply voltages, and the like. However, it is likewise contemplated that in other embodiments, all or a portion of the sense amplifier testing functionality may be implemented using components embedded on integrated circuit 10, and thus a minimum of control signals may be provided by the test system.

It is noted that although the above embodiments are shown using scannable flip-flops 208, it is contemplated that in other embodiments the scannable flip-flops 208 may be removed, and scannable S/R latches may be used, thereby eliminating the flip-flops 208. A scannable element refers to a sequential logic element such as a flip-flop, for example, that may capture a data value in response to a clock or other signal during a normal operation, and then capture a scan data value in response to a scan enable signal. It is also contemplated that in another embodiment, the latched values from the S/R latches 206 may be stored directly within a memory array (not shown) on the integrated circuit 10, and upon completion of the testing, the memory array data may be output for analysis.

It is further noted that in one embodiment, integrated circuit 10 may be implemented as a test chip on a wafer, in which case the integrated circuit 10 may not have other functionality. In other embodiments, sense amplifier modules 15 may be implemented within the scribe lines of a wafer. In still other embodiments, integrated circuit 10 may include other functionality. For example, integrated circuit 10 may be a processor chip, a communication chip, a controller, or the like. In such embodiments, the sense amplifier modules 15 may be implemented as just one part of the integrated circuit 10 chip. One such embodiment is shown in FIG. 4.

Figure 4:
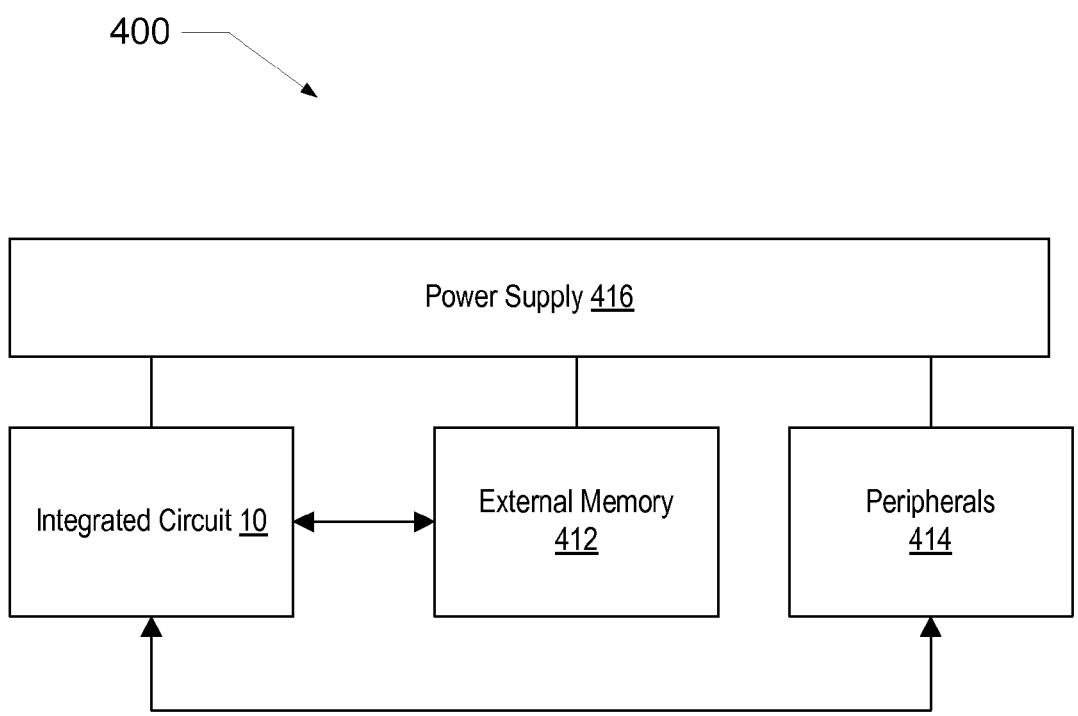
FIG. 4 is a block diagram of one embodiment of a system including the integrated circuit shown in FIG. 1

Turning to FIG. 4, a block diagram of one embodiment of a system 400 including the integrated circuit 10 is shown. The system 400 includes at least one instance of the integrated circuit 10 of FIG. 1 coupled to one or more peripherals 414 and an external memory 412. The system 400 also includes a power supply 416 that may provide one or more supply voltages to the integrated circuit 10 as well as one or more supply voltages to the memory 412 and/or the peripherals 414. In some embodiments, more than one instance of the integrated circuit 10 may be included.

The external memory 412 may be any desired memory. For example, the memory may include dynamic random access memory (DRAM), static RAM (SRAM), flash memory, or combinations thereof. The DRAM may include synchronous DRAM (SDRAM), double data rate (DDR) SDRAM, DDR2 SDRAM, DDR3 SDRAM, etc.

The peripherals 414 may include any desired circuitry, depending on the type of system 110. For example, in one embodiment, the system 400 may be a mobile device and the peripherals 414 may include devices for various types of wireless communication, such as WiFi, Bluetooth, cellular, global position system, etc. The peripherals 414 may also include additional storage, including RAM storage, solid-state storage, or disk storage. The peripherals 414 may include user interface devices such as a display screen, including touch display screens or multi-touch display screens, keyboard or other keys, microphones, speakers, etc.

Although the embodiments above have been described in considerable detail, numerous variations and modifications will become apparent to those skilled in the art once the above disclosure is fully appreciated. It is intended that the following claims be interpreted to embrace all such variations and modifications.

What is claimed is:

1. An integrated circuit comprising:
one or more sense amplifier modules, each including:
one or more sense amplifier circuits;
a voltage generator unit configured to selectably supply a differential voltage of a plurality of differential voltages to at least some of the one or more sense amplifier circuits;
wherein each sense amplifier circuit is configured to generate an output value that is dependent upon the applied differential voltage in response to receiving an enable signal; and
detection logic coupled to each of the sense amplifier circuits and configured to detect an output value of each of the one or more sense amplifier circuits;
wherein the detection logic includes one or more latch circuits, each configured to latch and output the output value of a corresponding one of the one or more sense amplifier circuits;
wherein the detection logic includes one or more flip-flop circuits, each coupled to a corresponding one of the latch circuits, wherein each flip-flop circuit is configured to capture and output a digital value that corresponds to the output value; and
wherein the one or more flip-flop circuits are coupled together in a scan chain such that an output of a first flip-flop is coupled to a scan data input of a next flip-flop and an output of the last flip-flop in the scan chain is coupled to a scan data output of the integrated circuit, and wherein in response to an assertion of a scan enable signal and a number of clock signal pulses, the captured digital values may be sequentially shifted out to the scan data output.

2. The integrated circuit as recited in claim 1, wherein the voltage generator unit is further configured to iteratively select a different differential voltage in response to a control input.

3. The integrated circuit as recited in claim 1, wherein the detection logic is further configured to capture the output value upon each change in differential voltage.

4. The integrated circuit as recited in claim 1, wherein the voltage generator unit comprises a voltage divider circuit having a plurality of output nodes and a multiplexer configured to select one of the output nodes as one of the differential voltages at a given time.

5. An integrated circuit comprising:
one or more sense amplifier circuits;
a voltage generator unit configured to selectably supply a differential voltage of a plurality of differential voltages to at least some of the one or more sense amplifier circuits;
wherein each sense amplifier circuit is configured to generate an output signal that is dependent upon the applied differential voltage in response to receiving an enable signal; and
detection logic coupled to each of the sense amplifier circuits and configured to latch and output the output value of a corresponding one of the one or more sense amplifier circuits to detect an output value of each of the one or more sense amplifier circuits;
wherein the detection logic includes one or more flip-flops, each configured to capture and output a digital value that corresponds to the output value of a corresponding one of the latch circuits in response to a transition of a clock signal that is provided following each change in the differential voltage of the voltage generator.

6. The integrated circuit as recited in claim 5, wherein the output value of each of the at least some of the sense amplifier circuits indicates whether a given sense amplifier circuit was able to detect a particular differential voltage.

7. The integrated circuit as recited in claim 5, wherein a transition in the output value of a given sense amplifier circuit corresponds to an operational threshold voltage differential for the given sense amplifier circuit.

8. The integrated circuit as recited in claim 5, wherein the voltage generator unit is further configured to iteratively select a different differential voltage in response to a control input.

9. A sense amplifier module comprising:
a sense amplifier circuit configured to output an output value corresponding to a received differential input voltage;
a voltage generator unit configured to selectably apply a plurality of the differential input voltages, one at a time, to an input of the sense amplifier;
detection logic including a latch circuit, wherein the detection logic is configured to latch and output the output value of the sense amplifier circuit to detect whether an output of the sense amplifier indicates successful operation for each of the differential voltages;
wherein the detection logic includes one or more flip-flops, each configured to capture and output a digital value that corresponds to the output value of the latch circuit in response to a transition of a clock signal that is provided following each change in the differential voltage of the voltage generator.

10. A method comprising:
executing a sense amplifier test using a sense amplifier module including a plurality of sense amplifier circuits within an integrated circuit, wherein executing the sense amplifier test comprises:
a voltage generator unit selectably supplying a differential voltage of a plurality of differential voltages to at least some of the plurality of sense amplifier circuits;
wherein the at least some of the sense amplifier circuits generating an output signal that is dependent upon the applied differential voltage and in response to receiving an enable signal; and
detection logic including a plurality of latch circuits, wherein the detection logic capturing the output value and outputting a corresponding digital value in response to a transition of clock signal, and detecting an output value of each of the plurality of sense amplifier circuits;
the detection logic includes one or more flip-flops, each capturing and outputting a digital value that corresponds to the output value of a corresponding one of the latch circuits in response to a transition of a clock signal that is provided following each change in the differential voltage of the voltage generator.

11. The method as recited in claim 10, further comprising the voltage generator unit iteratively selecting a different differential voltage in response to a control input.

12. The method as recited in claim 10, wherein iteratively selecting a different differential voltage includes a multiplexer selecting a different output node of a voltage divider network.

* * * * *